(12) United States Patent
Oskotsky et al.

(10) Patent No.: US 6,775,069 B2
(45) Date of Patent: Aug. 10, 2004

(54) ADVANCED ILLUMINATION SYSTEM FOR USE IN MICROLITHOGRAPHY

(75) Inventors: Mark Oskotsky, Mamaroneck, NY (US); Lev Ryzhikov, Norwalk, CT (US); Scott Coston, New Milford, CT (US); James Tsacoyeanes, Southbury, CT (US); Peter J. Baumgartner, Bethel, CT (US); Walter Augustyn, Monroe, CT (US)

(73) Assignee: ASML Holding N.V., Veldhoven (NL)

( * ) Notice: Subject to any disclaimer, the term of this patent is extended or adjusted under 35 U.S.C. 154(b) by 2 days.

(21) Appl. No.: 10/270,556

(22) Filed: Oct. 16, 2002

(65) Prior Publication Data

US 2003/0076679 A1 Apr. 24, 2003

Related U.S. Application Data

(60) Provisional application No. 60/329,758, filed on Oct. 18, 2001.

(51) Int. Cl.[7] .................. G02B 27/10; G02B 13/22; G02B 15/14; G03B 27/54; F21V 13/00
(52) U.S. Cl. ............... 359/624; 359/663; 359/676; 355/67; 362/268
(58) Field of Search ...................... 359/622, 624, 359/676, 663, 668; 355/67; 362/268

(56) References Cited

U.S. PATENT DOCUMENTS

| | | | | |
|---|---|---|---|---|
| 5,343,489 | A | 8/1994 | Wangler | 372/93 |
| 5,631,721 | A | 5/1997 | Stanton et al. | 355/71 |
| 6,307,682 | B1 | 10/2001 | Hoffman et al. | 359/663 |
| 2003/0227609 | A1 * | 12/2003 | Oskotsky et al. | 355/67 |

FOREIGN PATENT DOCUMENTS

| | | |
|---|---|---|
| DE | 44 21 053 A1 | 12/1995 |
| EP | 0 747 772 A1 | 12/1996 |
| EP | 1 014 196 A2 | 6/2000 |
| EP | 1 180 726 A2 | 2/2002 |
| EP | 1 291 720 A2 | 3/2003 |
| EP | 1372034 A2 * | 12/2003 ............. G03F/7/20 |
| WO | WO 01/61411 A1 | 8/2001 |

OTHER PUBLICATIONS

European Search Report for European Patent Application No. EP 02 02 3411, date of completion Jun. 27, 2003.

* cited by examiner

Primary Examiner—David N. Spector
(74) Attorney, Agent, or Firm—Sterne, Kessler, Goldstein & Fox, P.L.L.C.

(57) ABSTRACT

The present invention relates to an illumination system including an illumination source, a beam conditioner placed in an optical path with the illumination source, a first diffractive array, a condenser system and a second diffractive array. The illumination source directs light through the beam conditioner onto the first diffractive array. The light is then directed to the condenser system placed in an optical path between the first diffractive array and second diffractive array. The condenser system includes a plurality of stationary optical elements and a plurality of movable optical elements. The plurality of movable optical elements are placed in an optical path with the plurality of stationary optical elements. The movable optical elements are capable of translation between the plurality of stationary optical element to zoom the light received from the first diffractive array. The second diffractive array is optically coupled to the condenser system, receives light from the condenser system, which in turn generates an illumination field at a reticle.

18 Claims, 13 Drawing Sheets

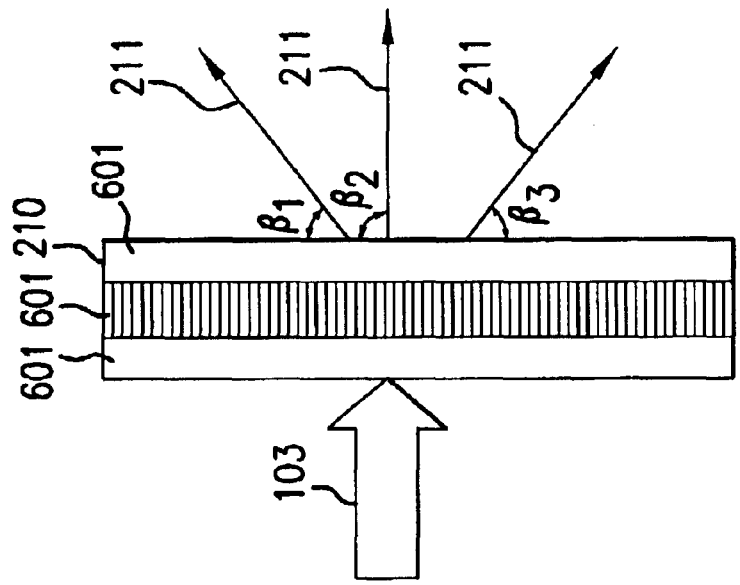
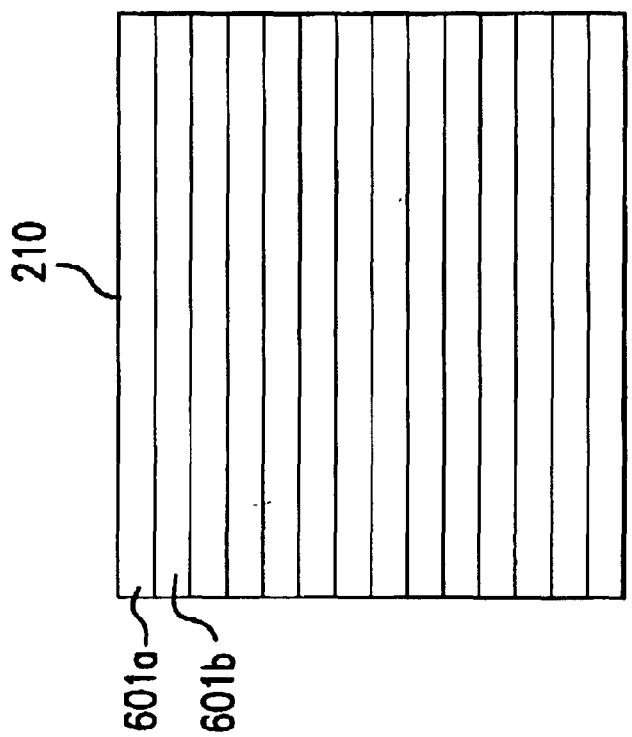

ADVANCED ILLUMINATION SYSTEM FOR USE IN MICROLITHOGRAPHY

CROSS-REFERENCE TO RELATED APPLICATIONS

This application claims priority of a U.S. Provisional Patent Application No. 60/329,758, to Oskotsky et al., filed Oct. 18, 2001, which is incorporated herein by reference in its entirety.

BACKGROUND OF THE INVENTION

1. Field of the Invention

The present invention relates generally to photolithographic illumination systems.

2. Background Art

Photolithography (also called microlithography) is a semiconductor device fabrication technology. Photolithography uses ultraviolet or visible light to generate fine patterns in a semiconductor device design. Many types of semiconductor devices, such as diodes, transistors, and integrated circuits, can be fabricated using photolithographic techniques. Exposure systems or tools are used to implement photolithographic techniques, such as etching, in semiconductor fabrication. An exposure system typically includes an illumination system, a reticle (also called a mask) containing a circuit pattern, a projection system, and a wafer alignment stage for aligning a photosensitive resist covered semiconductor wafer. The illumination system illuminates a region of the reticle with a preferably rectangular slot illumination field. The projection system projects an image of the illuminated region of the reticle circuit pattern onto the wafer.

As semiconductor device manufacturing technology advances, there are ever increasing demands on each component of the photolithography system used to manufacture the semiconductor device. This includes the illumination system used to illuminate the reticle. For example, there is a need to illuminate the reticle with an illumination field having uniform irradiance. In step-and-scan photolithography, there is also a need to continuously vary a size of the illumination field in a direction perpendicular to a wafer scan direction, so that the size of the illumination field can be tailored to different applications. One factor often limiting wafer processing throughput is the amount of energy available from the illumination system. As a result, there is a need to vary the size of the illumination field without a loss of energy.

As the size of the illumination field is varied, it is important to preserve the angular distribution and characteristics of the illumination field at the reticle. To achieve this goal, the illumination system must maintain telecentric illumination at a substantially fixed numerical aperture at the reticle as the size of the illumination field is varied. Some illumination systems include a scattering optical element, such as an array, positioned before the reticle. The scattering optical element produces a desired angular light distribution that is subsequently imaged or relayed to the reticle. In such an illumination system, there is a need to maintain telecentric illumination at a substantially fixed numerical aperture at the scattering optical element, and correspondingly, at the reticle as the size of the illumination field is varied.

A standard zoom lens can vary the size of the illumination field. However, in the standard zoom lens, image magnification, and correspondingly the size of the illumination field, is inversely proportional to angular magnification. Thus, a standard zoom lens that increases the size of an image by a factor M, disadvantageously decreases the numerical aperture by a factor I/M, and fails to preserve the angular distribution of the illumination field.

Therefore, there is a need to vary the size of the illumination field (that is, magnify the illumination field) without a loss of energy, and to maintain telecentric illumination at the numerical aperture as the size of the illumination field is varied.

BRIEF SUMMARY OF THE INVENTION

The present invention generally relates to illumination systems in photolithography. More specifically, the present invention relates to systems and methods for varying a size of an illumination field at a reticle in an optical system.

In one embodiment of the present invention, an illumination system, according to the present invention, includes an illumination source, a first diffractive array, a second diffractive array, and a condenser system placed in an optical path between the first diffractive array and the second diffractive array. The first diffractive array, also referred to as a field space array, is a double diffractive array. A light passing through the first diffractive array has a specific numerical aperture. The numerical aperture determines the size and/or shape of the illumination field at the reticle. In one embodiment, the first diffractive array is a diffractive grid capable of passing through light of different order of magnitude and refracting it out at various angles. In another embodiment, the first diffractive array includes a plurality of microlenses capable of refracting light at various angles. The second diffractive array, also referred to as a pupil array, is a double diffractive array similar in structure to the first diffractive array. The second diffractive array is able to expand and/or reduce the size of the illumination field formed at the reticle by a light passing through the second diffractive array.

According to a further feature, the condenser system includes a plurality of cylindrical and/or cross-cylindrical lenses having powers in scanning and/or cross-scanning directions. The condenser system includes a plurality of stationary lenses and a plurality of movable lenses. The plurality of stationary lenses includes an input lens and an output lens. The plurality of movable lenses includes a number of lenses capable of translation between the input and the output lenses. By translating movable lenses between the input and the output lenses, the condenser system expands and/or reduces the magnitude of a light passing through the condenser system and, hence, the size of the illumination field formed by the light at the reticle. In one embodiment, the condenser system has four lenses, including two stationary lenses (input and output lenses) and two movable lenses. In another embodiment, the condenser system has five lenses, including two stationary lenses (input and output lenses) and three movable lenses. Yet, other embodiments can include different numbers of lenses.

In operation, light from the illumination source is incident upon the beam conditioner. The beam conditioner conditions the light and directs it towards the first diffractive array. The first diffractive array processes the conditioned light. The conditioned light after passing through the first diffractive array has a specific numerical aperture. The conditioned light passing through first diffractive array can have a different size and/or shape numerical aperture. Light from the first diffractive array is incident upon the condenser system. The condenser system condenses the light directed from the first diffractive array. The condensed light forms a condenser system illumination field before passing through the second diffractive array. As used herein, the term condensed light means light having expanded and/or reduced magnitude. The second diffractive array processes the condensed light. The condensed light, after passing through the second diffractive array, forms an illumination field at the reticle. The properties of the illumination field are determined by the size and/or shape of the numerical aperture and by the magnification and/or reduction coefficients of the optical elements in the condenser system.

Further features and advantages of the present invention as well as the structure and operation of various embodiments of the present invention are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 6a is a top view of a microlens assembly within the diffractive array, according to the present invention.

FIG. 6b is a side view of a microlens assembly within the diffractive array, according to the present invention.

The present invention is described with reference to the accompanying drawings. In the drawings, like reference numbers indicate identical or functionally similar elements. Additionally, the leftmost digit of a reference number identifies the drawing in which the reference number first appears.

DETAILED DESCRIPTION OF THE INVENTION

Table of Contents

1. Advanced Illumination System for Use in Microlithography.
   A. Example Illumination System.
   B. Condenser System.
      B.1. 4-Lens Condenser System.
      B.2. Light Path in 4-Lens Condenser System.
      B.3. 5-Lens Condenser System.
      B.4. Light Path in 5-Lens Condenser System.
2. Conclusion.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

1. Advanced Illumination System for Use in Microlithography.

A. Example Illumination System.

Figure 1:
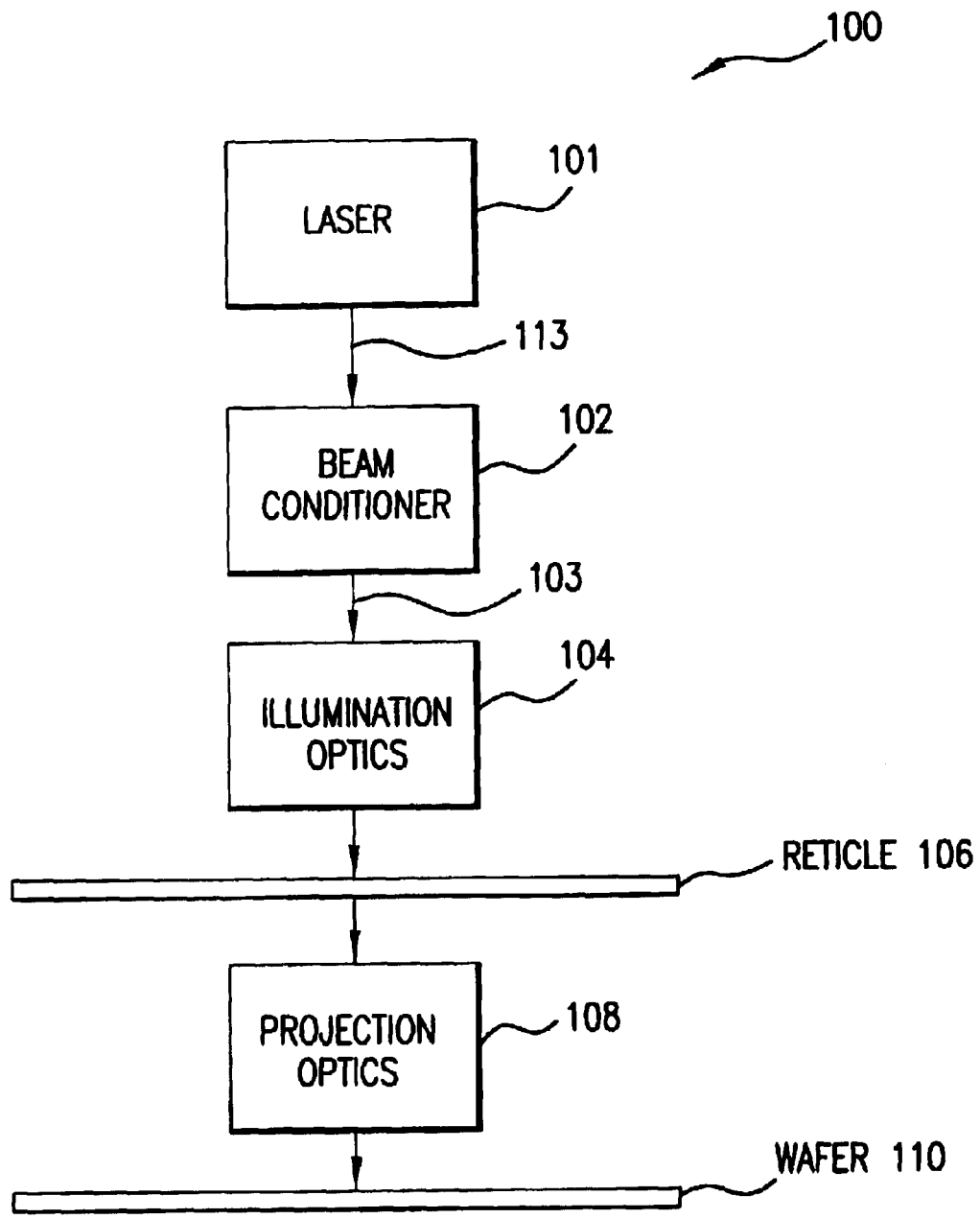
FIG. 1 illustrates an example embodiment of an optical system.

FIG. 1 illustrates an exemplary environment where the present invention can be implemented. An optical system 100 for expanding light 113 emitted from an illumination source (e.g., a laser) 101. The light 113 is received by a beam conditioner 102. The beam conditioner 102 a conditioned light to illumination optics 104, which in turn transmits light through a mask or reticle 106 onto a substrate 110 via projection optics 108. One embodiment for this system can be a lithography system, or the like.

Illumination source 101 directs a light into beam conditioner 102. Illumination source 101 may be a laser having a wavelength, such as an ultraviolet wavelength, that is not in the visible region. An example application of the present invention uses wavelengths which include, but are not limited to, 248 nanometers (nm), 193 nm, and 157 nm. Additionally, illumination source 101 may be a pulsed laser or a continuous wave laser. Beam conditioner 102 conditions light 113 received from illumination source 101. Beam conditioner 102 produces a collimated beam having a defined cross-section. This can be accomplished by a beam expander such as a refractive optical system, or a reflective optical system. An exemplary beam conditioner is described in U.S. Pat. No. 5,631,721, Hybrid Illumination System for Use in Photolithography, by S. Stanton, et al., incorporated herein by reference in its entirety.

Conditioned light 103 from beam conditioner 102 is incident upon illumination optics 104.

Figure 2A:
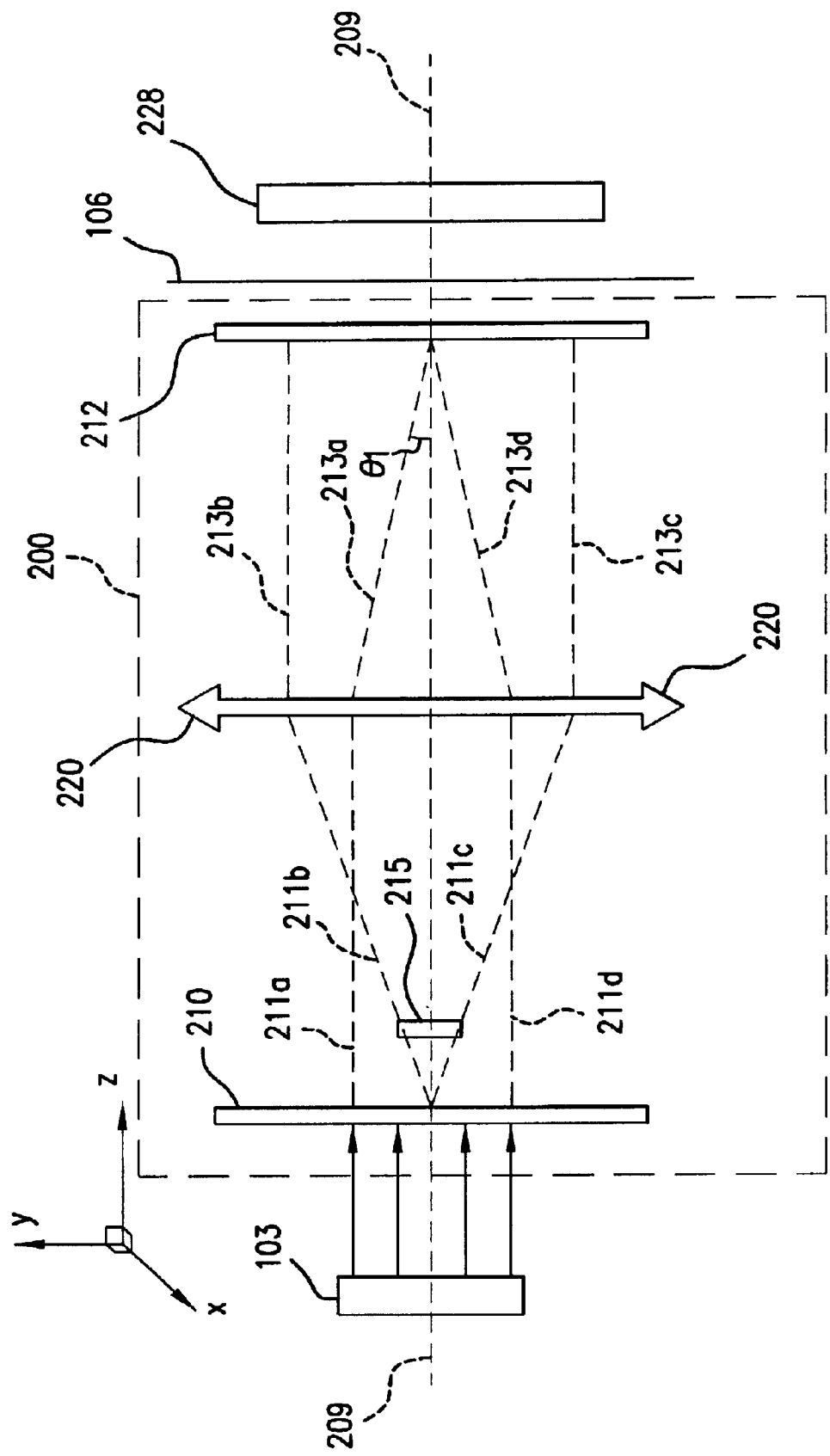
FIG. 2a illustrates an embodiment of an illumination system according to the present invention.

FIG. 2a illustrates an embodiment of an illumination system 200 for illuminating reticle 106, according to the present invention. Illumination optics 104 can include illumination system 200. Illumination system 200 includes a first diffractive array or field array 210, a second diffractive array or pupil array 212, a condenser system 220 placed in an optical path between first diffractive array 210 and second diffractive array 212. In illumination system 200, above-described optical elements are placed along an optical axis 209.

First diffractive array 210 is placed along optical axis 209 with condenser system 220 and initially processes conditioned light 103. First diffractive array or field space array 210 is a double diffractive array. First diffractive array 210 can be a diffractive grid or a microlens assembly that allows passage of light in the first, second, third and so forth order. Each order represents passage of light at different angles. First diffractive array 210 provides spatial and temporal coherence treatment for the conditioned light 103 entering illumination system 200. Furthermore, first diffractive array 210 provides high transmission of light.

Second diffractive array 212 is positioned along optical axis 209 with condenser system 220. Light 213 from condenser system 220 is incident upon second diffractive array 212. Second diffractive array 212 acts as a pupil and is capable of changing a magnitude of a light and forming delimiter field 228. Second diffractive array or a pupil space array 212 is also a double diffractive array. Similarly to first diffractive array 210, second diffractive array 212 can include diffractive grid or a microlens assembly. Second diffractive array 212 provides spatial and temporal coherence treatment. Also, second diffractive array 212 allows for high transmission of light.

Condenser system 220 allows the light passing through illumination system 200 to vary the size of delimiter (or reticle) field 228. Condenser system 220 includes a plurality of lenses that vary magnitude of the light, passing through condenser system 220, and, hence the size of delimiter field 228. The plurality of lenses in condenser system 220 can expand and/or reduce the magnitude of the light. The size and/or shape of delimiter field 228 indicates how much light is incident upon reticle 106. Condenser system 220 includes a plurality of cylindrical lenses and/or cross-cylindrical lenses. Embodiments of condenser system 220 are described further with respect to FIGS. 3a–4d.

Figure 5B:
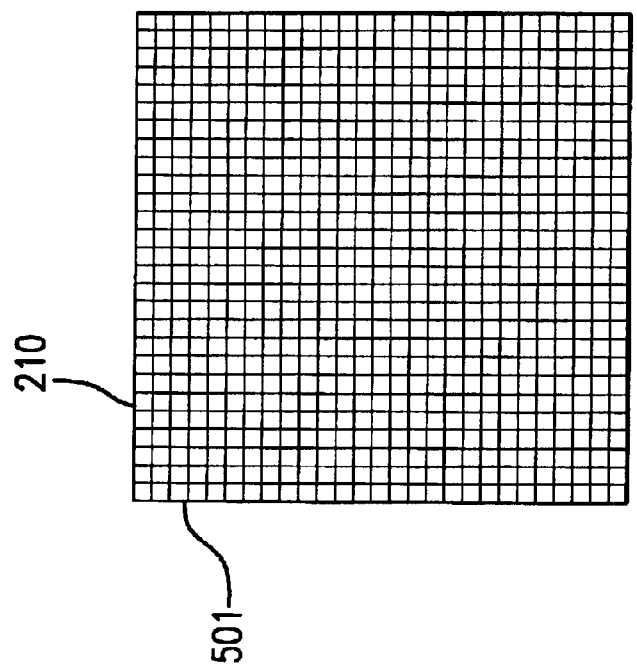
FIG. 5b is a top view of a diffractive grid within the diffractive array, according to the present invention.
Figure 5A:
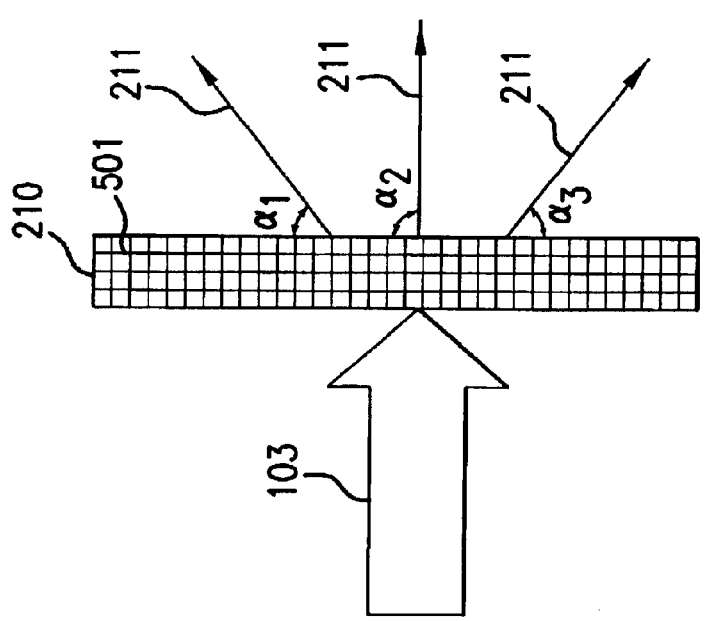
FIG. 5a is a side view of a diffractive grid within a diffractive array, according to the present invention.

FIGS. 5a and 5b illustrate a simplified view of the diffractive grid embodiment of first diffractive array 210. FIG. 5a illustrates a side view of first diffractive array 210. FIG. 5b illustrates a top view of first diffractive array 210, shown in FIG. 5a. Referring to FIG. 5a, conditioned light 103 passes through a diffractive grid 501 of first diffractive array 210. Diffractive grid 501 reflects out conditioned light 103 at different angles $\alpha_1$, $\alpha_2$, and $\alpha_3$ with respect to optical axis 209, as shown in FIG. 5a.

Another embodiment of first diffractive array 210 is shown in FIGS. 6a and 6b. In this embodiment, first diffractive array 210 includes a plurality of microlenses 601. Microlenses 601 can be placed in a variety of configurations as shown in FIG. 6b. In other words, first diffractive array 210 can include a plurality of microlens assemblies 601 variably aligned. Microlenses 601 can be placed parallel to Y-direction as well as parallel to X-direction. Microlenses 601 receive conditioned light 103 and reflect it out at various angles $\beta_1$, $\beta_2$, and $\beta_3$, with respect to optical axis 209, as shown in FIG. 6b.

Figure 2B:
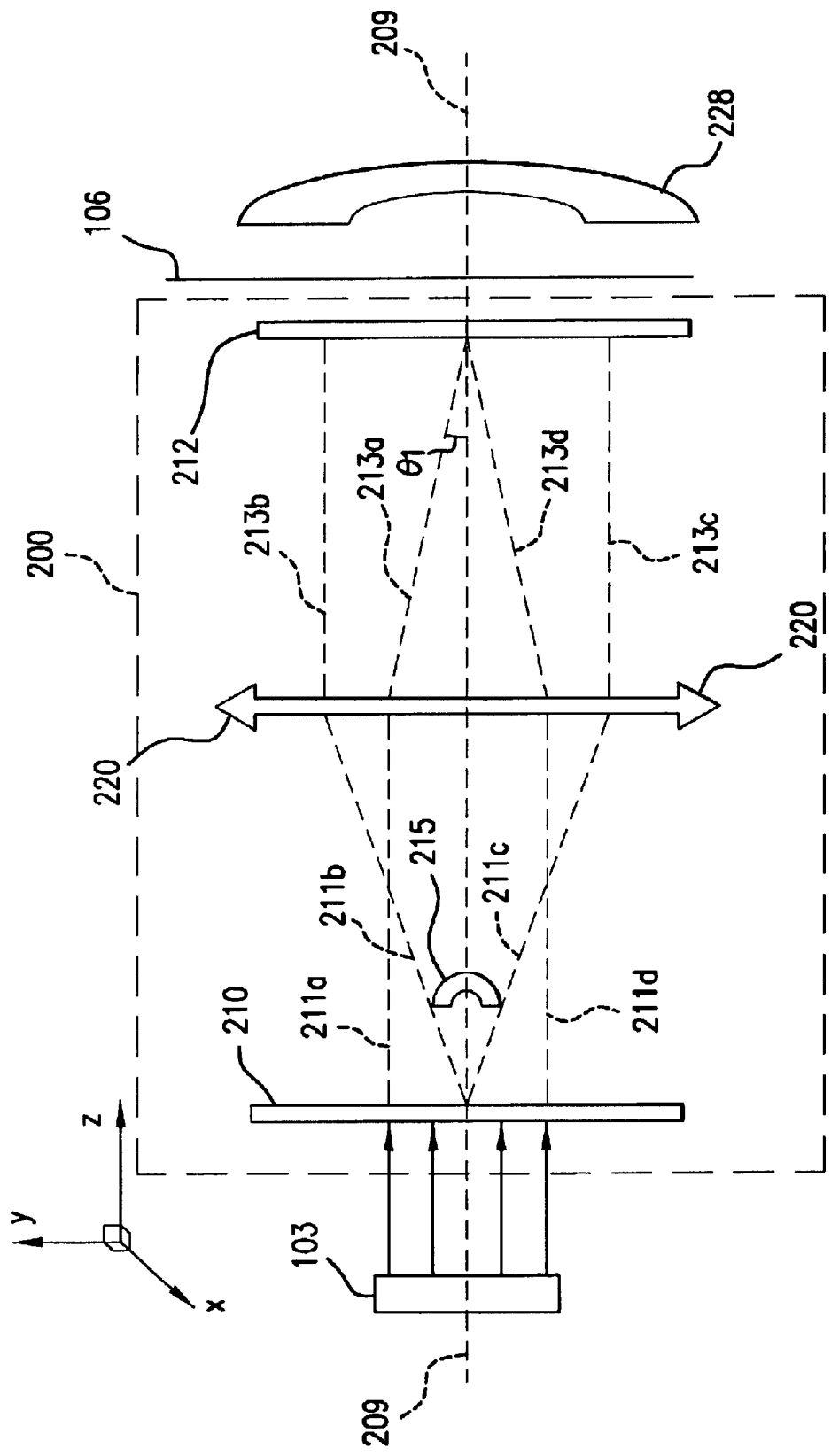
FIG. 2b illustrates another embodiment of an illumination system according to the present invention.

Referring back to FIG. 2a, conditioned light 103 is directed along optical axis 209 towards reticle (also referred to as "delimiter") 106. First diffractive array 210 receives conditioned light 103. After processing conditioned light 103, first diffractive array 210 directs light 211 towards condenser system 220. The light 211, after passing through first diffractive array 210, has a numerical aperture 215. Numerical aperture 215 indicates a size and/or shape of delimiter field 228 at reticle 106. Numerical aperture ($NA_1$) 215 is defined as follows:

$$NA_1 = n \cdot \sin(\theta_1) \quad (1)$$

wherein n is an index of refraction of the optical propagating medium (in this case, first diffractive array 210) and $\theta_1$ is an angle of refraction, formed by the light generating delimiter field 228. Therefore, size of numerical aperture ($NA_1$) 215 controls the size of delimiter field 228. In other words, the larger the numerical aperture 215, the larger the delimiter field 228. The shape of numerical aperture 215 also controls the shape of illumination filed 228. In FIG. 2a embodiment, numerical aperture 215 is rectangular, therefore, delimiter field 228 is rectangular. In FIG. 2b embodiment, numerical aperture 215 has an arc shape, therefore, delimiter field 228 has an arc shape. Other shapes and sizes of numerical aperture 215 and its corresponding delimiter field 228 are possible. In other words, first diffractive array 210 can be modified so that the light 211 can have any size and/or shape numerical aperture 215. Hence, light 213 can subsequently form corresponding size and/or shape delimiter field 228.

First diffractive array 210 directs light 211 towards condenser system 220 along optical axis 209. Condenser system 220 is used to change size of delimiter field 228. Light passing through condenser system 220 generates a zoomable field in a cross-scan direction. The condenser system 220 can be anamorphic to achieve generation of such zoomable field. In other words, the light passing through condenser system 220 is capable of varying size of delimiter field 228 in the Y-direction. Condenser system 220 is also capable of preserving or maintaining an angular distribution of light incident to second diffractive array 212, while the light passing through condenser system 220 varies the size of the delimiter field 228. Condenser system 220 maintains a uniform radiant flux density of light (radiant flux incident per unit area of a surface), while the size of delimiter field 228 (and, hence, the amount of light incident upon reticle 106) is varied. For example, the light passing through condenser system 220 is able to vary delimiter field 228 in the range from about 11 mm to about 26 mm. The size and/or shape of delimiter field 228 is application specific. Condenser system 220 is further described in FIGS. 3a14 4d.

B. Condenser System.

In accordance with the present invention, condenser system 220 substantially preserves and maintains a predetermined angular distribution of light incident upon reticle 106, while the size of the delimiter field 228 is varied. To achieve this, condenser system 220 maintains telecentric illumination at numerical aperture 215, while the size of the delimiter field 228 is varied. Condenser system 220 also maintains a uniform irradiance and a predetermined amount of energy that is transferred to reticle 106 by illumination system 200, while the size of the delimiter field 228 is varied. The operation of condenser system 220 is described further below.

FIGS. 3a–3d and 4a–4d illustrate various embodiments of condenser system 220. FIGS. 3a–3d illustrate 4-lens condenser system 220. FIGS. 4a–4d illustrate 5-lens condenser system 220.

B.1. 4-Lens Condenser System.

Figure 3A:
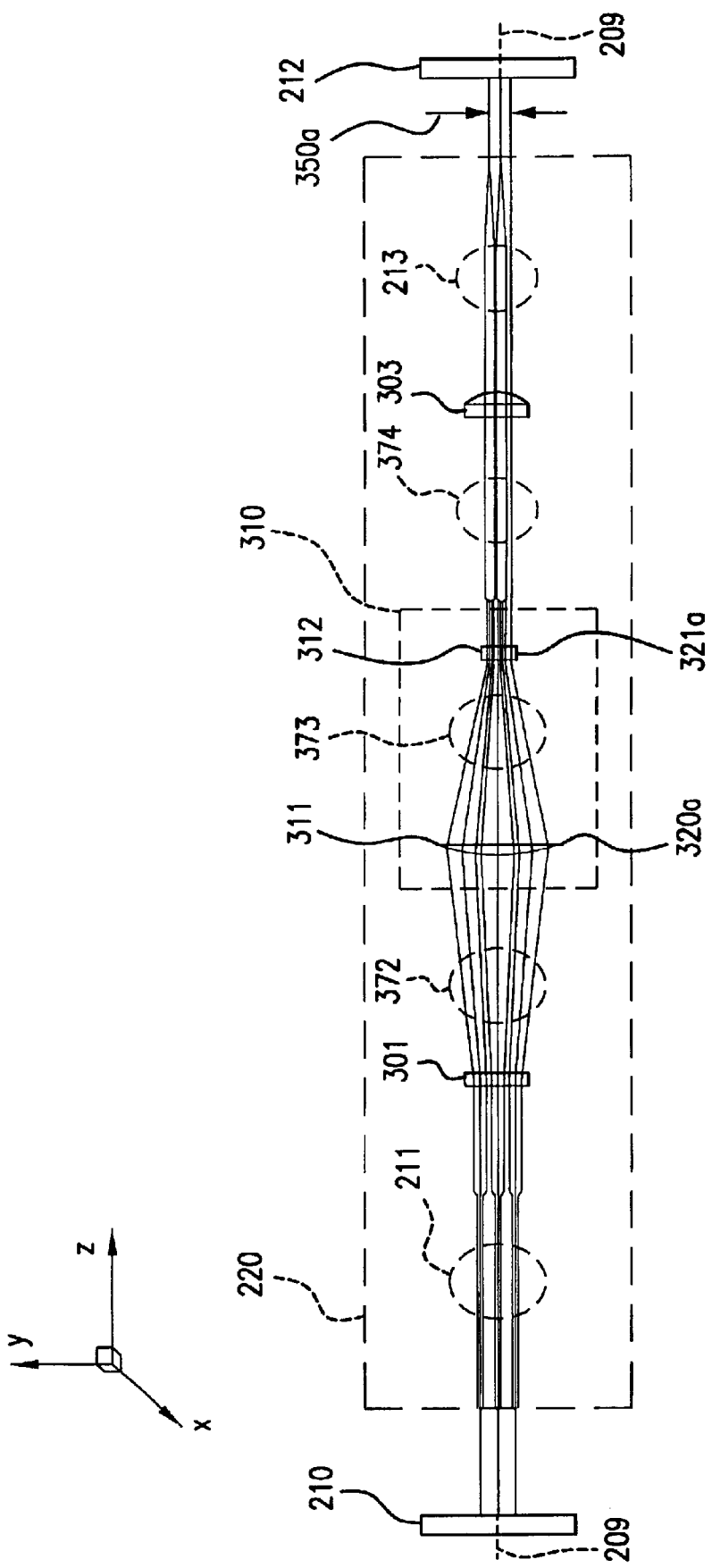
FIG. 3a illustrates an embodiment of a 4-lens condenser system of the illumination system of FIGS. 2a and 2b in a first lens position, according to the present invention.

FIG. 3a illustrates 4-lens condenser system 220, placed along optical axis 209 between first diffractive array 210 and second diffractive array 212. 4-lens condenser system 220 includes an input lens 301, an output lens 303 and a zoom lens section 310. Zoom lens section 310 is placed along optical axis 209 between input lens 301 and output lens 303. Zoom lens section 310 includes a first zoom lens 311 and a second zoom lens 312.

In this embodiment, input lens 301 and output lens 303 are stationary lenses and zoom lens section 310 is capable of translation along optical axis 209 between input lens 301 and output lens 303. First zoom lens 311 is capable of translation along optical axis 209 between input lens 301 and second zoom lens 312. Second zoom lens 312 is capable of translation along optical axis 209 between first zoom lens 311 and output lens 303. By translating first zoom lens 311 and/or second zoom lens 312 along optical axis 209, zoom lens section 310 translates along optical axis 209 between input lens 301 and output lens 303.

By adjusting respective distances between input lens 301, first zoom lens 311, second zoom lens 312, and output lens 303, condenser system 220 condenses a light passing through the condenser system 220. The condensed light forms an illumination field 350 before the condensed light passes through second diffractive array 212, as shown in FIG. 3a. As used herein, condensed light means light having expanded and/or reduced magnitude. The condensed light outputted from condenser system 220 is capable of varying the size of illumination field 350. Furthermore, the refractive power of input lens 301, first zoom lens 311, second zoom lens 312, and output lens 303 also affects the magnitude of light passing through condenser system 220 and, hence, affecting the size of illumination field 350. Illumination field 350 determines the size of delimiter field 228 formed at reticle 106.

Depending on the size of illumination field 350, input lens 301, output lens 303, first zoom lens 311, and second zoom lens 312 can have positive or negative refractive power. Furthermore, input lens 301 and output lens 303 are cylindrical lenses having optical powers in cross-scanning direction (or along X and Y axis). First zoom lens 311 and second zoom lens 312 are cylindrical lenses having optical powers in scanning direction (or along Y-axis or along X-axis). In a particular embodiment, in order to minimize energy loss and range of motion of lenses in zoom lens group 310, during operation of condenser system 220, the ratio of cross-scan optical powers of lenses in zoom lens group 310 can be in the range from 1:−0.3 to 1:−0.8. In the alternative, lenses in the condenser system 220 can be cross-cylindrical lenses.

Figure 3B:
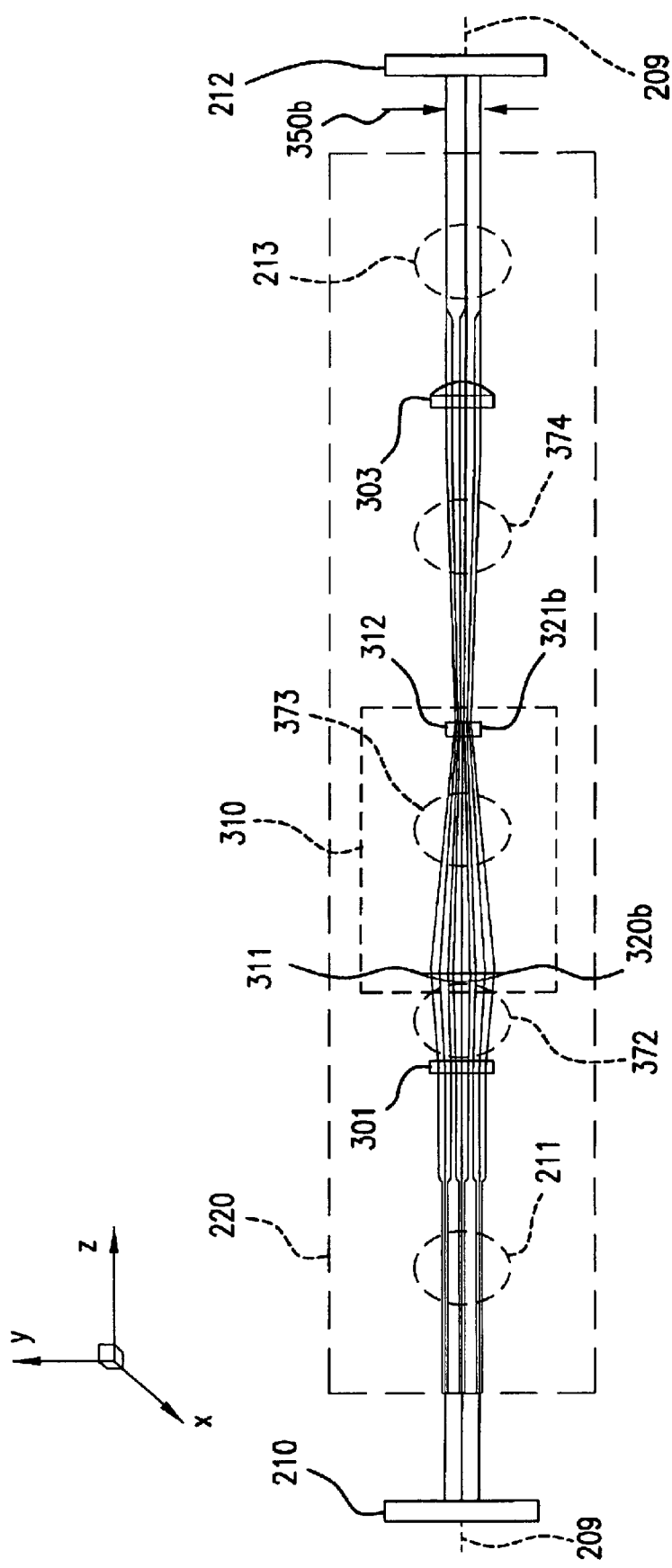
FIG. 3b illustrates the 4-lens condenser system shown in FIG. 3a in a second lens position, according to the present invention.
Figure 3C:
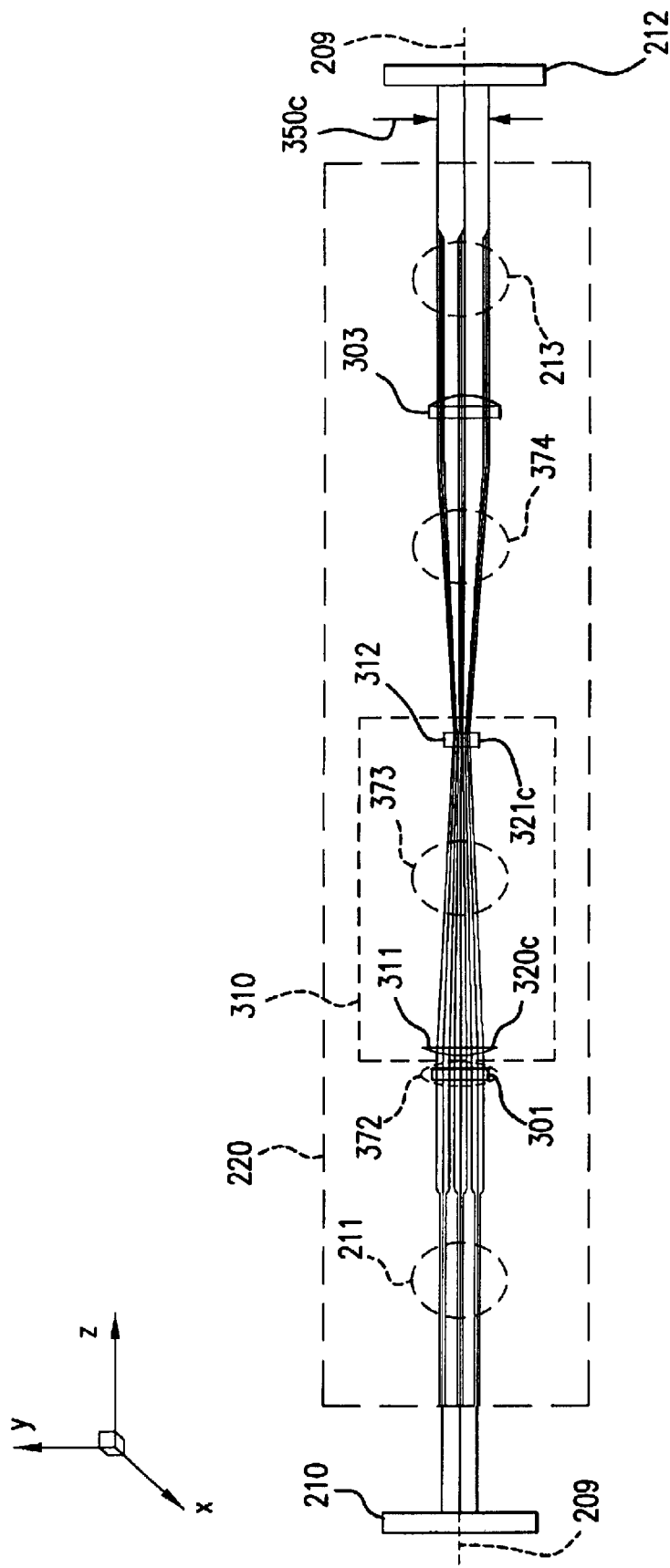
FIG. 3c illustrates the 4-lens condenser system shown in FIG. 3a in a third lens position, according to the present invention.
Figure 3D:
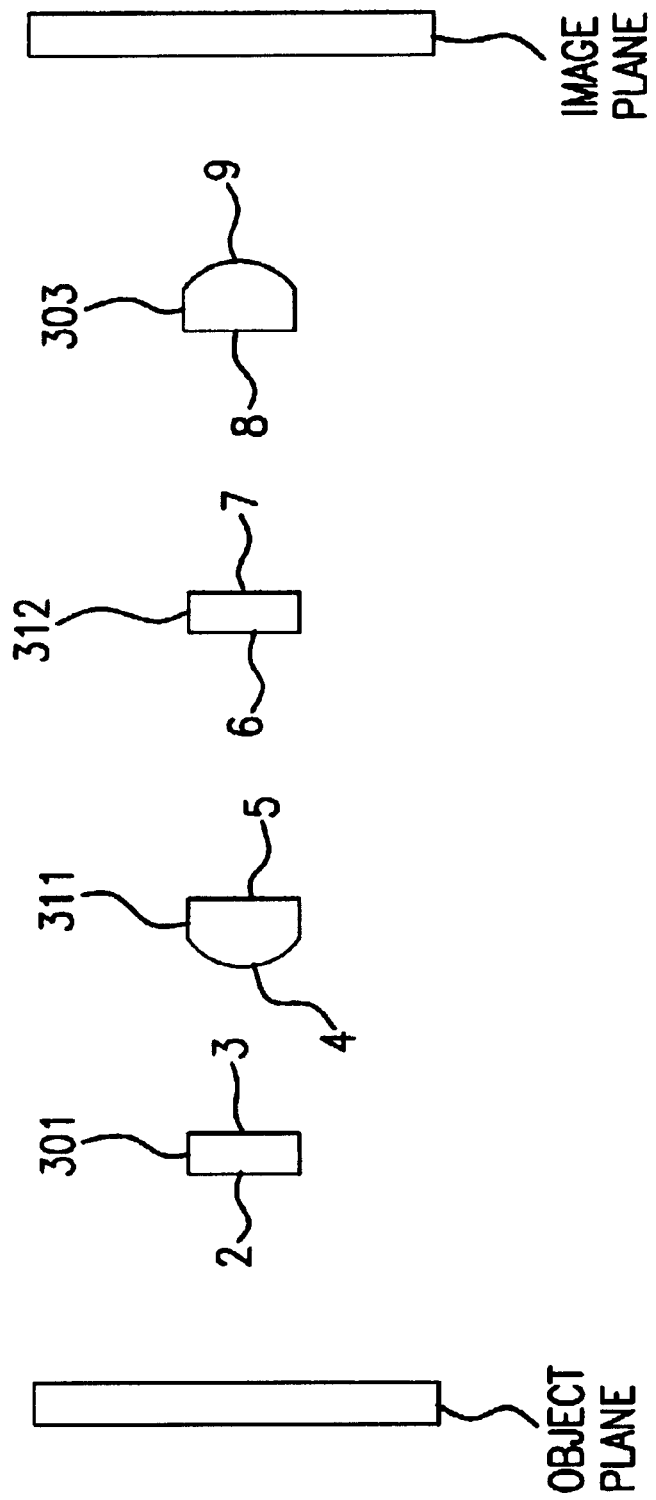
FIG. 3d illustrates a plurality of optical elements along with corresponding optical surfaces of the 4-lens condenser system shown in FIGS. 3a–3c, according to the present invention.

The following Table 1 (See Appendix 1) is a prescription data for an embodiment of 4-lens condenser system described with respect to FIGS. 3a–3c. FIG. 3d illustrates optical elements with corresponding optical surfaces of condenser system 220. Input lens 301 has optical surfaces 2 and 3, as shown in FIG. 3d. First zoom lens 311 has optical surfaces 4 and 5. Second zoom lens 312 has optical surfaces 6 and 7. Output lens 303 has optical surfaces 8 and 9. The optical elements are placed between an object plane and an image plane. Table 1 indicates optical properties of each optical element in condenser system 220 (input lens 301, first zoom lens 311, second zoom lens 312, and output lens 303), such as thickness, radius, material and others.

B.2. Light Path in 4-Lens Condenser System

Referring to FIG. 3a, light 211 is incident upon input lens 301 of condenser system 220. Input lens 301 changes magnitude of light 211. As used herein, the term changing magnitude of light means expanding and/or reducing the magnitude of light. After refraction by input lens 301, light 211 becomes first condensed light 372. As used herein, the term condensed light means a light having expanded and/or reduced magnitude. Input lens 301 directs first condensed light 372 towards zoom lens section 310.

First zoom lens 311 of zoom section 310, in position 320a, receives first condensed light 372, as shown in FIG. 3a. First zoom lens 311 changes magnitude of first condensed light 372. After refraction by first zoom lens 311, first condensed light 372 becomes second condensed light 373. First zoom lens 311 directs second condensed light 373 towards second zoom lens 312 in position 321a, as shown in FIG. 3a.

Second zoom lens 312, in position 321a, receives second condensed light 373, as shown in FIG. 3a. Second zoom lens 312 changes magnitude of second condensed light 373. After refraction by second zoom lens 312, second condensed light 373 becomes third condensed light 374. Second zoom lens 312 directs third condensed light 374 towards output lens 303.

Output lens 303 receives third condensed light 374. Output lens 303 changes magnitude of third condensed light 374. After refraction by output lens 303, third condensed light 374 becomes condensed light 213. Output lens 303 directs condensed light 213 towards second diffractive array 212. Furthermore, condensed light 213 forms an illumination field 350a before entering second diffractive array 212. The size of illumination field 350a depends on position 320a of first zoom lens 311 and position 321 a of second zoom lens 312.

Referring to FIG. 3b, first zoom lens 311 has a position 320b and second zoom lens 312 has a position 321b. Because lenses 311 and 312 are so positioned, condenser system 220 forms an illumination field 350b. Illumination field 350b can have a different size as compared with illumination field 350a of FIG. 3a.

Referring to FIG. 3c, first zoom lens 311 has a position 320c and second zoom lens 312 has a position 321c. Because lenses 311 and 312 are so positioned, condenser system 220 forms an illumination field 350c. Illumination field 350c can have a different size as compared with illumination fields 350a of FIG. 3a and 350b of FIG. 3b.

B.3. 5-Lens Condenser System.

Figure 4A:
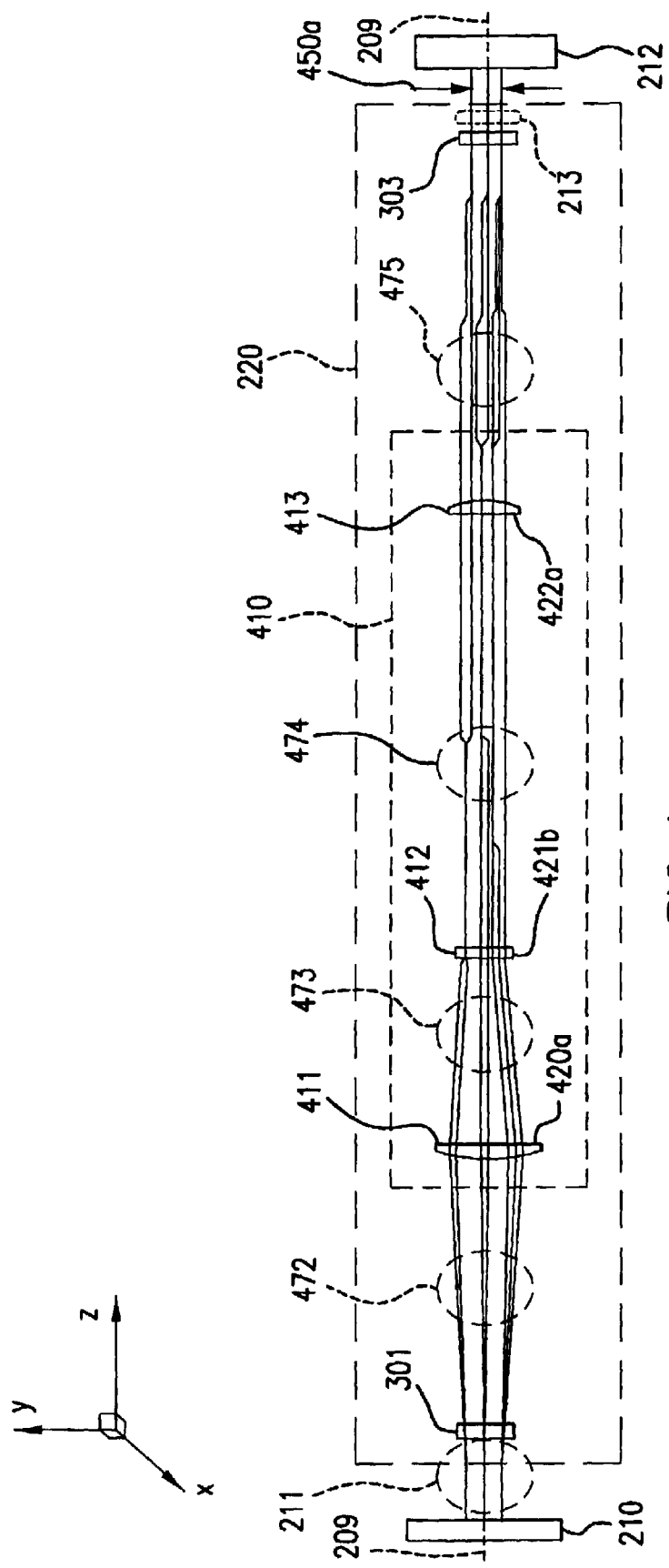
FIG. 4a illustrates an embodiment of a 5-lens condenser system of the illumination system of FIGS. 2a and 2b in a first lens position, according to the present invention.

FIG. 4a illustrates 5-lens condenser system 220, placed along optical axis 209 between first diffractive array 210 and second diffractive array 212. 5-lens condenser system 220 includes an input lens 301, an output lens 303 and a zoom lens section 410. Zoom lens section 410 is placed along optical axis 209 between input lens 301 and output lens 303. Zoom lens section 410 includes a first zoom lens 411, a second zoom lens 412, and a third zoom lens 413.

In this embodiment, input lens 301 and output lens 303 are stationary lenses and zoom lens section 410 is capable of translation along optical axis 209 between input lens 301 and output lens 303. First zoom lens 411 is capable of translation along optical axis 209 between input lens 301 and second zoom lens 412. Second zoom lens 412 is capable of translation along optical axis 209 between first zoom lens 411 and third zoom lens 413. Third zoom lens 413 is capable of translation along optical axis 209 between second zoom lens 412 and output lens 303. By translating first zoom lens 411, second zoom lens 412 and/or third zoom lens 413 along optical axis 209, zoom lens section 410 translates along optical axis 209 between input lens 301 and output lens 303.

By adjusting respective distances between input lens 301, first zoom lens 411, second zoom lens 412, third zoom lens 413 and output lens 303, condenser system 220 condenses a light passing through the condenser system 220. The condensed light forms an illumination field 450 before the condensed light passes through second diffractive array 212, as shown in FIG. 4a. As used herein, condensed light means light having expanded and/or reduced magnitude. The condensed light outputted from condenser system 220 is capable of varying the size of illumination field 450. Furthermore, the refractive power of input lens 301, first zoom lens 411, second zoom lens 412, third zoom lens 413 and output lens 303 also affects the magnitude of light passing through condenser system 220 and, hence, affecting the size of illumination field 450. Illumination field 450 determines the size of delimiter field 228 formed at reticle 106.

Depending on the size of illumination field 450, input lens 301, output lens 303, first zoom lens 411, second zoom lens 412, and third zoom lens 413 can have positive or negative refractive power. Furthermore, input lens 301 and output lens 303 are cylindrical lenses having optical powers in cross-scanning direction (or along X and Y axis). First zoom lens 411, second zoom lens 412, and third zoom lens 413 are cylindrical lenses having optical powers in scanning direction (or along Y-axis or along X-axis). In a particular embodiment, in order to minimize energy loss and range of motion of lenses in zoom lens group 410, during operation of condenser system 220, the ratio of cross-scan optical powers of lenses in zoom lens group 410 can be in the range from 1:−0.3 to 1:−0.8. In the alternative, lenses in the condenser system 220 can be cross-cylindrical lenses.

Figure 4B:
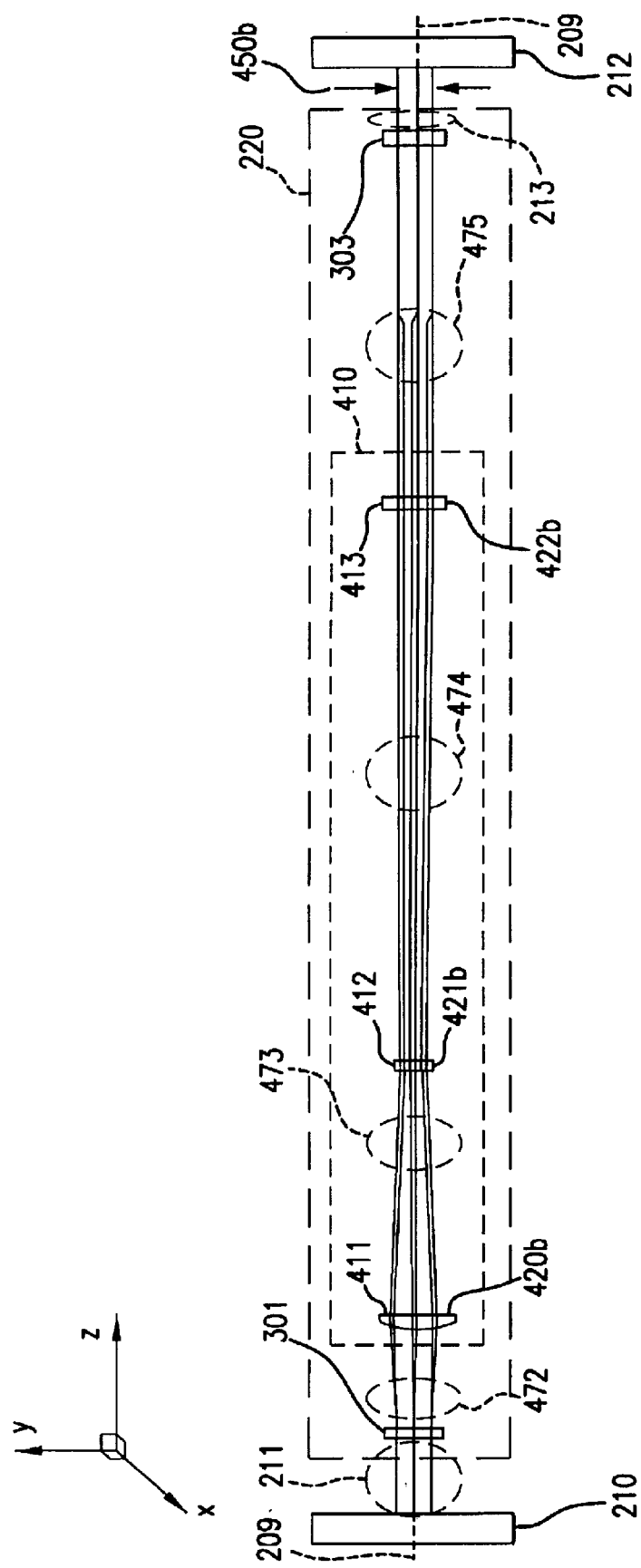
FIG. 4b illustrates the 5-lens condenser system shown in FIG. 4a in a second lens position, according to the present invention.
Figure 4C:
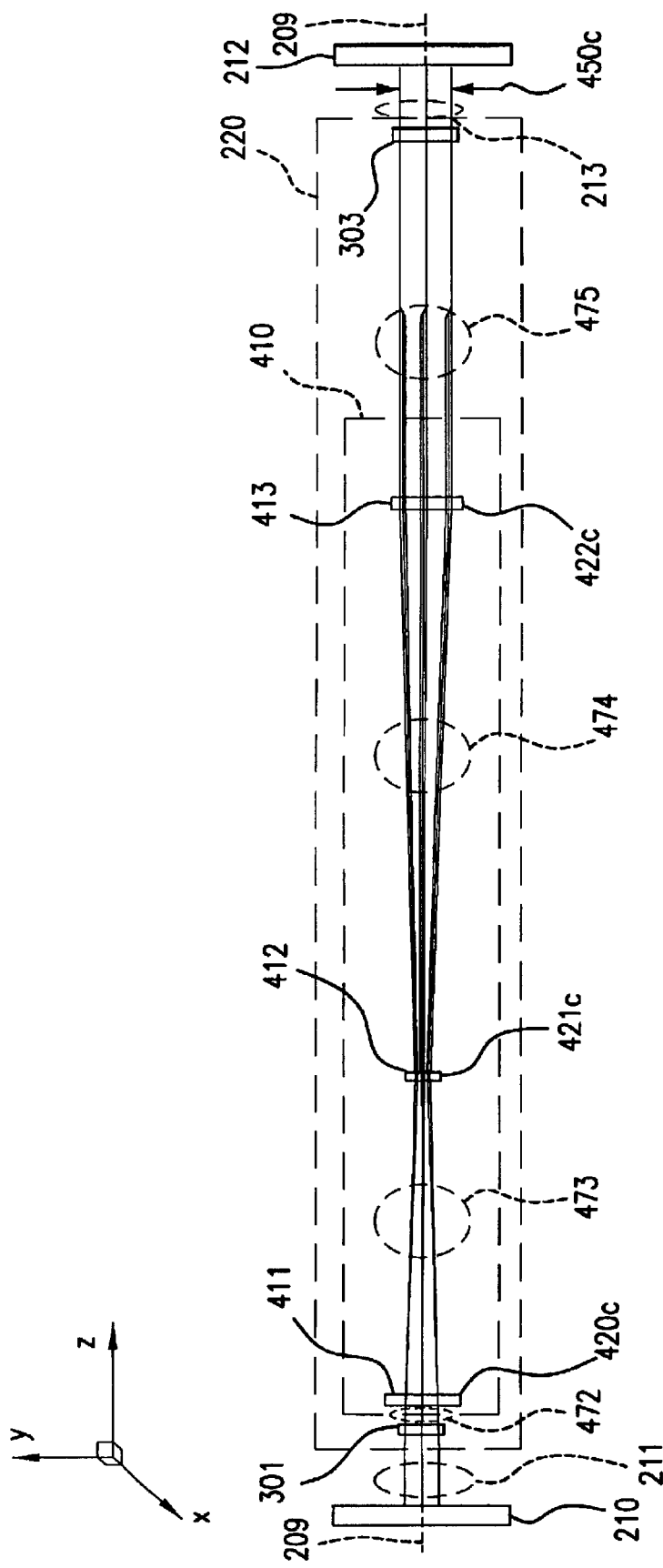
FIG. 4c illustrates the 5-lens condenser system shown in FIG. 4a in a third lens position, according to the present invention
Figure 4D:
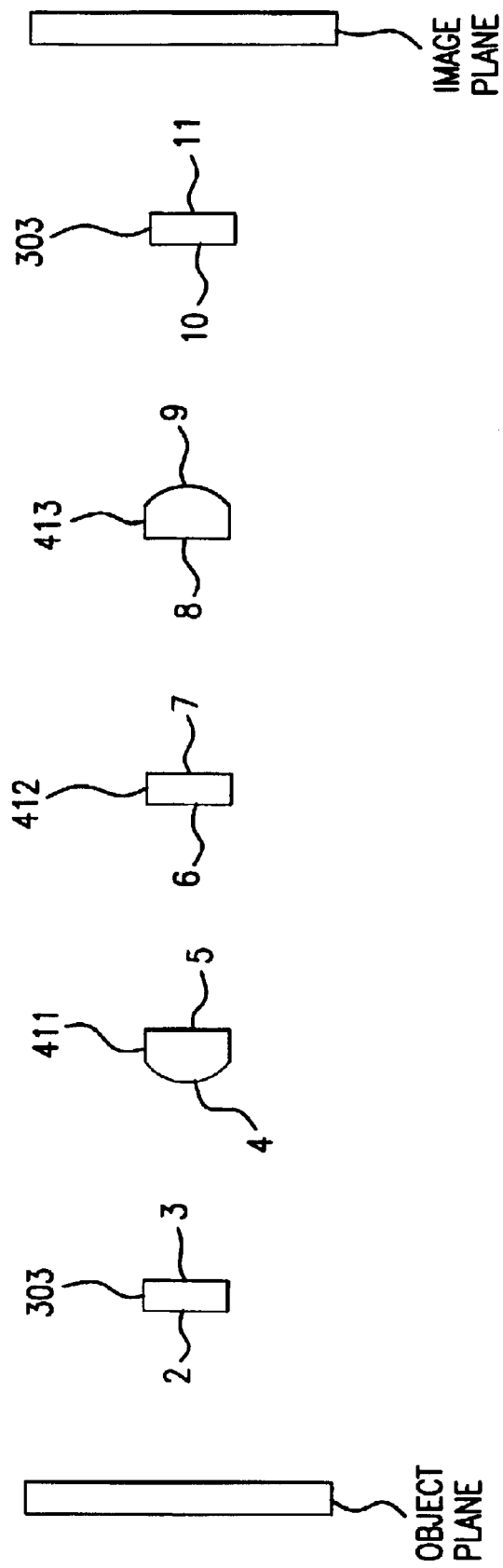
FIG. 4d illustrates a plurality of optical elements along with corresponding optical surfaces of the 5-lens condenser system shown in FIGS. 4a–4c, according to the present invention.

The following Table 2 (See Appendix 2) is a prescription data for an embodiment of 5-lens condenser system described with respect to FIGS. 4a–4c. FIG. 4d illustrates optical elements with corresponding optical surfaces of condenser system 220. Input lens 301 has optical surfaces 2 and 3, as shown in FIG. 4d. First zoom lens 411 has optical surfaces 4 and 5. Second zoom lens 412 has optical surfaces 6 and 7. Third zoom lens 413 has optical surfaces 8 and 9. Output lens 303 has optical surfaces 10 and 11. The optical elements are placed between an object plane and an image plane. Table 2 indicates optical properties of each optical element in condenser system 220 (input lens 301, first zoom lens 411, second zoom lens 412, third zoom lens 413, and output lens 303), such as thickness, radius, material and others.

B.2. Light Path in 5-Lens Condenser System

Referring to FIG. 4a, light 211 is incident upon input lens 301 of condenser system 220. Input lens 301 changes magnitude of light 211. As used herein, the term changing magnitude of light means expanding and/or reducing the magnitude of light. After refraction by input lens 301, light 211 becomes first condensed light 472. As used herein, the term condensed light means a light having expanded and/or reduced magnitude. Input lens 301 directs first condensed light 472 towards zoom lens section 410.

First zoom lens 411 of zoom section 410, in position 420a, receives first condensed light 472, as shown in FIG. 4a. First zoom lens 411 changes magnitude of first condensed light 472. After refraction by first zoom lens 411, first condensed light 472 becomes second condensed light 473. First zoom lens 411 directs second condensed light 473 towards second zoom lens 412 in position 421a, as shown in FIG. 4a.

Second zoom lens 412, in position 421a receives second condensed light 473, as shown in FIG. 4a. Second zoom lens 412 changes magnitude of second condensed light 473. After refraction by second zoom lens 412, second condensed light 473 becomes third condensed light 474. Second zoom lens 412 directs third condensed light 474 towards third zoom lens 413 in position 422a, as shown in FIG. 4a.

Third zoom lens 413, in position 422a, receives third condensed light 474. Third zoom lens 413 changes magnitude of third condensed light 474. After refraction by third zoom lens 413, third condensed light 474 becomes fourth condensed light 475. Third zoom lens 413 directs fourth condensed light 475 towards output lens 303.

Output lens 303 receives fourth condensed light 475. Output lens 303 changes magnitude of fourth condensed light 475. After refraction by output lens 303, fourth condensed light 475 becomes condensed light 213. Output lens 303 directs condensed light 213 towards second diffractive array 212. Furthermore, condensed light 213 forms an illumination field 450a before entering second diffractive array 212. The size of illumination field 450a depends on position 420a of first zoom lens 411, position 421a of second zoom lens 412, and position 422a of third zoom lens 413.

Referring to FIG. 4b, first zoom lens 411 has a position 420b, second zoom lens 412 has a position 421b, and a third zoom lens 413 has a position 422b. Because lenses 411, 412, and 413 are so positioned, condenser system 220 forms an illumination field 450b. Illumination field 450b can have a different size as compared with illumination field 450a of FIG. 4a.

Referring to FIG. 4c, first zoom lens 411 has a position 420c, second zoom lens 412 has a position 421c, and a third zoom lens 413 has a position 422c. Because lenses 411, 412, and 413 are so positioned, condenser system 220 forms an illumination field 450c. Illumination field 450c can have a different size as compared with illumination fields 450a of FIGS. 4a and 450b of FIG. 4b.

2. Conclusion.

Example embodiments of the methods, systems, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An optical system for illumination of a field at a delimiter, comprising:
 a first diffractive array;
 a second diffractive array; and
 a condenser system, placed in an optical path between said first diffractive array and said second diffractive array, wherein said condenser system further comprises:
 a plurality of stationary optical elements; and
 a plurality of movable optical elements,
 wherein said movable optical elements are capable of translation relative to said plurality of stationary optical elements.

2. The optical system of claim 1, wherein said first diffractive array is a field space array capable of generating a rectangular numerical aperture.

3. The optical system of claim 1, wherein said first diffractive array is a field space array capable of generating a curved numerical aperture.

4. The optical system of claim 1, wherein said plurality of stationary optical elements comprises:
 an input lens group; and
 an output lens group.

5. The optical system of claim 4, wherein said input lens group further comprises an input cross-cylindrical lens.

6. The optical system of claim 4, wherein said output lens group further comprises at least one cross-cylindrical lens and at least one cylindrical lens.

7. The optical system of claim 1, wherein said plurality of movable optical elements further comprises a plurality of zoomable lenses.

8. The optical system of claim 7, wherein said plurality of zoomable lenses further comprises at least one cylindrical lens having cross-scan optical power.

9. The optical system of claim 8, wherein said at least one cylindrical lens has cross-scan optical power in the range of 1:−0.3 to 1:−0.8.

10. The optical system of claim 1, wherein said second diffractive array is a pupil array.

11. The optical system of claim 1, wherein said condenser system further comprises two stationary optical elements and two movable optical elements.

12. The illumination system of claim 1, wherein said condenser system further comprises two stationary optical elements and three movable optical elements.

13. A condenser system for use in an illumination system that illuminates a field of a delimiter, the illumination system comprising:

an input stationary optical group;

an output stationary optical group; and a zoomable lens group placed in an optical path along with said input stationary optical group and said output stationary optical group;

wherein said zoomable lens group is capable of translating relative to said input stationary optical group and said output stationary optical group;

wherein locations of said input stationary optical group, said output stationary optical group, and said zoomable lens group along the optical path can be adjusted to vary the size of the field of the delimiter in the illumination system.

14. The condenser system of claim 13, wherein said input stationary optical group further comprises input cross-cylindrical lens.

15. The condenser system of claim 13, wherein said output stationary optical group further comprises at least one cross-cylindrical lens and at least one cylindrical lens.

16. The condenser system of claim 13, wherein said zoomable lens group further comprises at least one cylindrical lens having cross-scan optical power.

17. The condenser system of claim 16, wherein said at least one cylindrical lens has cross-scan optical power in the range of 1:−0.3 to 1:−0.8.

18. A method for illuminating a field of a delimiter in a photolithographic illumination system, having an optical path, comprising the steps of:

(a) receiving a light with an input stationary optical group;

(b) at least one of magnifying or reducing the light with a zoomable lens group placed in the optical path with the input stationary optical group, wherein said step (b) further comprises translating the zoomable lens group along the optical path;

(c) illuminating the delimiter with the light directed from an output stationary optical group;

wherein said steps (a) through (c) further comprise:

varying the size of the field of the delimiter in the illumination system.

* * * * *